United States Patent
Meng et al.

[11] Patent Number: 5,466,965
[45] Date of Patent: Nov. 14, 1995

[54] HIGH EFFICIENCY, HIGH POWER MULTIQUANTUM WELL IMPATT DEVICE WITH OPTICAL INJECTION LOCKING

[75] Inventors: Charles C. Meng, Los Angeles; Harold R. Fetterman, Pacific Palisades, both of Calif.

[73] Assignee: The Regents of the University of California, Oakland, Calif.

[21] Appl. No.: 984,148

[22] Filed: Dec. 2, 1992

[51] Int. Cl.⁶ ............................ H01L 29/90; H01L 31/10
[52] U.S. Cl. ............................ 257/604; 257/21; 257/15; 257/23; 257/186; 257/625
[58] Field of Search ................................ 257/604, 21, 15, 257/23, 186, 625; 372/45

[56] References Cited

U.S. PATENT DOCUMENTS

| | | | |
|---|---|---|---|
| 3,510,734 | 5/1970 | Mankarious et al. | 257/625 |
| 4,716,449 | 12/1987 | Miller | 257/21 |
| 4,857,972 | 8/1989 | Jorke et al. | 257/18 |
| 4,866,488 | 9/1989 | Frensley | 257/17 |
| 5,216,260 | 6/1993 | Schubert et al. | 257/604 |

*Primary Examiner*—Robert Limanek
*Attorney, Agent, or Firm*—Daniel L. Dawes; Beehler & Pavitt

[57] ABSTRACT

Multiple quantum wells within an impact avalanche transit time device (IMPATT) utilizing a plurality of gallium arsenide/aluminum gallium arsenide heterojunctions are used to provide a high power, high frequency, high efficiency device operating at 50 GHz and up. The multiple quantum wells defined by the heterojunctions between pairs of gallium arsenide quantum wells and aluminum gallium arsenide barrier layers improves the nonlinearity of the avalanche process within the gallium arsenide quantum wells and reduces the ionization rate saturation limitations. Optical injection locking of the current through the IMPATT device is achieved by irradiating the active layer of the IMPATT device with modulated laser light.

16 Claims, 2 Drawing Sheets

HIGH EFFICIENCY, HIGH POWER MULTIQUANTUM WELL IMPATT DEVICE WITH OPTICAL INJECTION LOCKING

This invention was made with U.S. Government support under Contract No. F49620-89-C-0056 awarded by the Air Force Office of Scientific Research. The U.S. Government has certain rights in this invention.

BACKGROUND OF THE INVENTION

1. Field of the Invention

The invention relates to the field of impact ionization avalanche transit time (IMPATT) devices and in particular to a structure for and method of operating a multiquantum well IMPATT device to achieve high power, high efficiency and low noise output in combination with optical injection locking.

2. Description of the Prior Art

High power, low noise, high frequency sources, particularly operating in the millimeter wave range, have many applications in air traffic control radars, communications systems, and modern weapons, typically in missile radars operating in the atmospheric window of 35 and 94 GHz. Normally, a phased locked Gunn oscillator operating at 35 or 94 GHz is used for injection locking in circuits in these types of applications.

However, the efficiency of a single flat gallium arsenide IMPATT device typically falls off dramatically at frequencies above 50 GHz. This is mainly due to the saturation of the ionization rates in the avalanche portions of the device, see T. Misawa, Solid State Electronics, 15(4) pages 457–65 (1972). The marked reduction of the nonlinearity of the avalanche process results in a wide avalanche injection current pulse and is responsible for the reduction in efficiency at high frequencies.

What is needed is a structure for an IMPATT device which can operate at high power levels and high efficiencies at high frequencies in excess of 50 GHz and which can be easily controlled by some type of injection locking.

BRIEF SUMMARY OF THE INVENTION

The invention is a multiple quantum well impact ionization avalanche transit time device (IMPATT) comprising a P+ substrate, a P+ buffer disposed adjacent to the P+ substrate, a plurality of N type heterojunctions forming a corresponding plurality of quantum wells disposed adjacent to the P+ buffer, an N type drift region disposed adjacent to the plurality of N type heterojunctions, and an N+ type cap layer disposed adjacent to the N type drift layer. As a result, a high power high efficiency IMPATT device is provided.

The device further comprises a heat sink disposed adjacent to the N+ type cap. The plurality of N type heterojunctions comprise a plurality of pairs of thin films. Each pair of the thin films comprises a barrier layer and a quantum well layer. The barrier layer has a greater energy gap than the quantum well layer. The barrier layer and the quantum well layer each have a thickness in the range of approximately 75 to 200 angstroms. In the illustrated embodiment the barrier layer and quantum well layer each have a thickness of approximately 100 angstroms. In the illustrated embodiment the barrier layer is comprised of aluminum gallium arsenide and the quantum well layer is comprised of gallium arsenide.

The plurality of N type heterojunctions is comprised of a plurality of pairs of layers forming each junction. One layer of the pair is a barrier layer and the other layer of the pair is a quantum well layer. The thickness of the layers have a length of approximately comparable to the energy relaxation length of electrons and holes. The device further comprises an element for irradiating at least the plurality of N type heterojunctions with light having the predetermined frequency. In the illustrated embodiment the plurality of N type heterojunctions comprise at least enough pairs of barrier and quantum well layers to equal the avalanche region of the device.

The substrate, buffer, drift and cap layers are comprised of gallium arsenide and the plurality of N type heterojunctions are comprised of pairs of gallium arsenide layers with corresponding aluminum gallium arsenide layers to form the heterojunction.

The layers collectively form a mesa structure having an apex and a base with the P+ substrate is at the apex of the mesa structure and the N+ cap layer is at the base of the mesa structure. The mesa structure is characterized by having a curved edge surface from the P+ substrate flaring out to a larger base of the N+ cap layer.

The invention is also characterized as a method of generating a narrow avalanche injection current in a IMPATT diode using multiquantum wells. Carriers are accelerated through a thin film barrier layer without creating substantial impact ionization. The accelerated carriers are injected from the thin film barrier layer into a thin film quantum well layer to generate substantial avalanche impact ionization. The quantum well layer thickness is limited by both the energy relaxation length and ionization mean free path. Therefore, it is necessary to introduce carriers into a multiquantum well structure in order to effectively lengthen the thickness of the avalanche region. The carriers generated by the impact ionization are injected into a subsequent thin film barrier layer. The steps of accelerating the carriers within successive thin film barrier layers and injecting the accelerated carriers into an adjacent thin film quantum well layer to generate this new efficient impact ionization of carriers are repeated so that high efficiency high frequency operation of the device is achieved. A carrier starts from nonzero energy to reach the ionization threshold energy for multiquantum well structures. The nonzero starting energy increases as the electric field becomes higher. Since a higher electric field leads to a stronger ionization rate enhancement, the ionization rate saturation limitations are reduced.

The method further comprises the step of irradiating the thin film barrier layers and thin film quantum well layers with light at a predetermined frequency having an energy at least as great as the energy gap of carriers in the thin film quantum well layers.

The steps of accelerating the carriers across the thin film barriers and generating impact ionization within the thin film quantum well are performed across a thickness of the thin film barrier layer and thin film quantum well layer cumulatively equal to approximately the energy relaxation length of electrons and holes.

The step of irradiating with light comprises the step of irradiating the thin film barrier layer and thin quantum well layer with modulated light to generate modulated photocurrent within the device.

The invention and its various embodiments will be better visualized by now turning to the following figures.

The invention in its various embodiments can now be understood in connection with the following detained description.

DETAILED DESCRIPTION OF THE PREFERRED EMBODIMENTS

The present invention is a multiquantum well impact ionization avalanche transit time (IMPATT) device operating at high power, low noise and at frequencies in excess of 50 GHz. The illustrated embodiment is described in connection with an improved IMPATT device operating with efficiencies of at least 14 percent in the 94 GHz atmospheric window and with at least 10 percent efficiency while operating in the 140 GHz atmospheric window. The saturation of ionization rates at high electric fields in the IMPATT device is improved by substituting a multiquantum well structure for the bulk material in the avalanche region.

Multiple quantum wells within an impact avalanche transit time device (IMPATT) utilizing a plurality of gallium arsenide/aluminum gallium arsenide heterojunctions are used to provide a high power, high frequency, high efficiency device. The multiple quantum wells defined by the heterojunctions between pairs of gallium arsenide quantum wells and aluminum gallium arsenide barrier layers improves the nonlinearity of the avalanche process within the gallium arsenide quantum wells and reduces the ionization rate saturation limitations. Optical injection locking of the IMPATT device is achieved by irradiating the active layer of the IMPATT device with modulated laser light.

The saturation of ionization rates at a high electric field results in a broad injected current pulse in a less localized avalanche region. This effect normally causes a fall off of the IMPATT diode efficiency at high frequencies. By replacing the bulk avalanche region by a plurality of thin film gallium arsenide/aluminum gallium arsenide multiquantum well layers, the saturation of ionization rates is improved.

Figure 1:
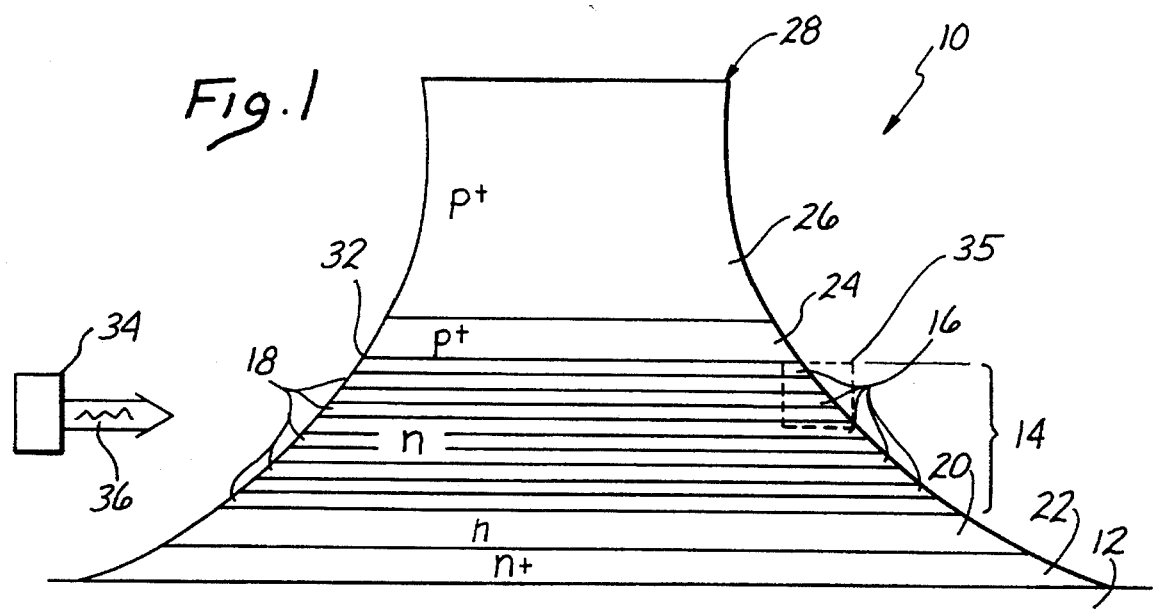
FIG. 1 is a highly diagrammatic cross-sectional view of an IMPATT device devised according to the invention shown in enlarged scale.

Turn first to FIG. 1 wherein a highly diagrammatic cross-sectional view of an IMPATT device devised according to the invention is shown in enlarged scale. The IMPATT device, generally denoted by reference numeral 10, is disposed upon a heat sink 12 which in the illustrated embodiment is a gold plated diamond substrate. Diamond is utilized because of its high thermal conductivity, but many other types of heat sinks could be employed. IMPATT device 10 illustrated in FIG. 1 has an avalanche region 14 of approximately 1000 angstroms in thickness made of a plurality of thin film heterojunctions of gallium arsenide 16 and aluminum gallium arsenide 18, each layer 16 and 18 of which is approximately 100 angstrom thick. The gallium arsenide layer 16 in combination with aluminum gallium arsenide layer 18 comprise a heterojunction having a combined width of approximately 200 angstroms. In the illustrated embodiment, five such pairs of regions 16 and 18 to constitute an avalanche region 14 of IMPATT device 10. Gallium arsenide layer 16 typically has a slightly higher doping level than aluminum gallium arsenide layer 18 for a simple material growth condition of constant Si flux. For example, in the illustrated embodiment, gallium arsenide layer 16 has a doping level of $2\times10^{17}$ dopants per cubic centimeter, while aluminum gallium arsenide layer 18 with 30% aluminum composition, has a doping level of approximately $1.4\times10^{17}$ dopants per cubic centimeter. Other doping levels consistent with the spirit of the teachings of the present invention may be used according the fabrication technology which is adopted. The transit time in the drift region 20 of the illustrated embodiment is optimal at 94 GHz when the electron saturation velocity is about $5\times10^6$ centimeters per second.

Avalanche region 14 is adjacent to an N-drift layer 20 which in the illustrated embodiment is a 1500 angstrom thick gallium arsenide layer with a doping concentration of approximately $2\times10^{17}$ dopants per cubic centimeter. Drift layer 20 in turn is disposed upon an N+ cap 22 in contact with thermal heat sink 12. Cap 22 in the illustrated embodiment is a 4000 thick angstrom gallium arsenide layer with a doping of approximately $2\times10^{18}$ dopants per cubic centimeter. Disposed on the top of active layer 14 is a P+ buffer layer 24 which in the illustrated embodiment is a gallium arsenide layer approximately 5000 angstroms thick and having a dopant concentration of approximately $2\times10^{19}$ dopants per cubic centimeter. A P+ substrate or cap 26 is then disposed on top of P+ buffer 24 and is comprised of a much thicker gallium arsenide substrate, the thickness of which is substantially immaterial to the operation of the invention and which has a dopant concentration of approximately $2\times10^{19}$ dopants per cubic centimeter.

Figure 4:
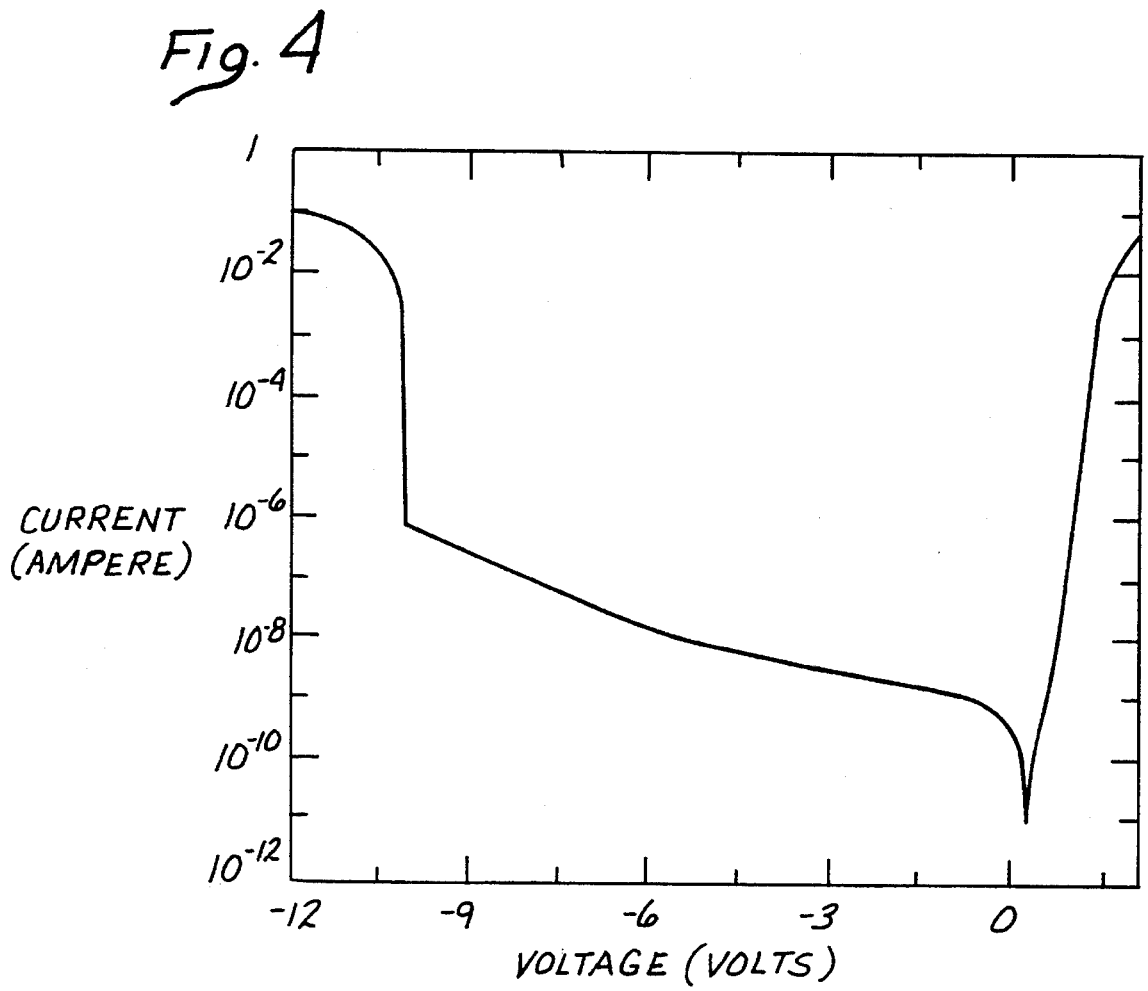
FIG. 4 is a graph of the current-voltage characteristics of the device shown in FIG. 1.

The layers 14 and 20-26 comprise a flip-chip mounted multiquantum well IMPATT diode having the profile in the form of a mesa with a curved linear side slope 28. A single drift flat profile device was designed and grown on a P+ gallium arsenide substrate 26 using $2\times10^{19}$ per cubic centimeter zinc doped material. First, a 5,000 angstrom P+ beryllium doped layer 24 ($2\times10^{19}$ dopants per cubic centimeter) was grown on (100) P+ gallium arsenide substrate. This was followed by the growth of 1,000 angstroms of N-avalanche regions 14 comprised of five periods of gallium arsenide/aluminum gallium arsenide (GaAs/$Al_{0.3}Ga_{0.7}As$) quantum wells each having a 100 angstrom barrier length and a 100 angstrom well length for the avalanche region. A 1,500 angstrom bulk gallium arsenide layer was provided for the transit time drift region 20. The doping density of gallium arsenide and aluminum gallium arsenide (GaAs/$Al_{0.3}Ga_{0.7}As$) layers were specified to be $2\times10^{17}$ dopants per cubic centimeter and $1.4\times10^{17}$ dopants per cubic centimeter respectively to keep a simple growth condition for a constant silicon flux. Finally a 4,000 angstrom N+ silicon doped layer ($2\times10^{18}$ dopants per centimeter cubed) was grown as cap layer 22. The current-voltage characteristics of the device are shown in the graph of FIG. 4 which illustrates a hard breakdown voltage of -10 volts. The occurrence of avalanche breakdown is evident from the fact that the breakdown voltage become even smaller when the device is cooled to 77 degrees Kelvin. The device also shows a low leakage current density, namely a maximum of $10^{-2}$ amperes per square centimeter. The device operates in IMPATT mode because the operating current density is at least six orders of magnitude higher than the maximum leakage current density.

During the fabrication of the device shown in FIG. 1, circular metal patterns and mesas were defined on the epitaxial side of a wafer using conventional photolithographic techniques. A gold germanium/nickel/gold metalization was used for the ohmic contact. A thick layer of silver, 75 microns, was electroplated on the epitaxial side of the wafer before the wafer was chemically thinned from the substrate side to facilitate handling of the thin wafer during the fabrication process. The ohmic loss caused by the remaining substrate is enhanced by the skin effect at high frequency at 100 GHz and is minimized by chemically thinning the device to several microns. After the wafer was chemically thinned, circular gold germanium/nickel/gold metal patterns and mesas were then defined on the substrate side of the thin wafer. Sulfuric acid/peroxide aqueous etching solution of various compositions were used to etch the mesas and for wafer thinning. Device separation was performed by dissolving the silver shim in nitric acid after the diodes are fabricated and alloyed on a supporting shim substrate. Each diode after separation was approximately 10 microns thick with a gold germanium (900 angstroms)/nickel (150 angstroms)/gold (1 micron) ohmic contact on both sides.

The epitaxial side of the diode was mounted on a diamond heat sink by thermal compression bonding and then the diode was packaged inside a 5-mil thick quartz ring having an 18-mil inner diameter and 30-mil outer diameter. A triple strap ribbon connected one end of the diode to the quartz ring. Inside the package, the ribbon prevents the top contact from shorting to the ground when the device is chemically trimmed. The final device area is adjusted by the trim procedure to have approximately one picoFarad at zero bias as determined by RF testing.

It must be expressly understood that the number of quantum wells, the well length, barrier length and barrier height may be varied from that described in the illustrated embodiment in a manner consistent with the present teachings to provide an optimal structure.

Figure 2:
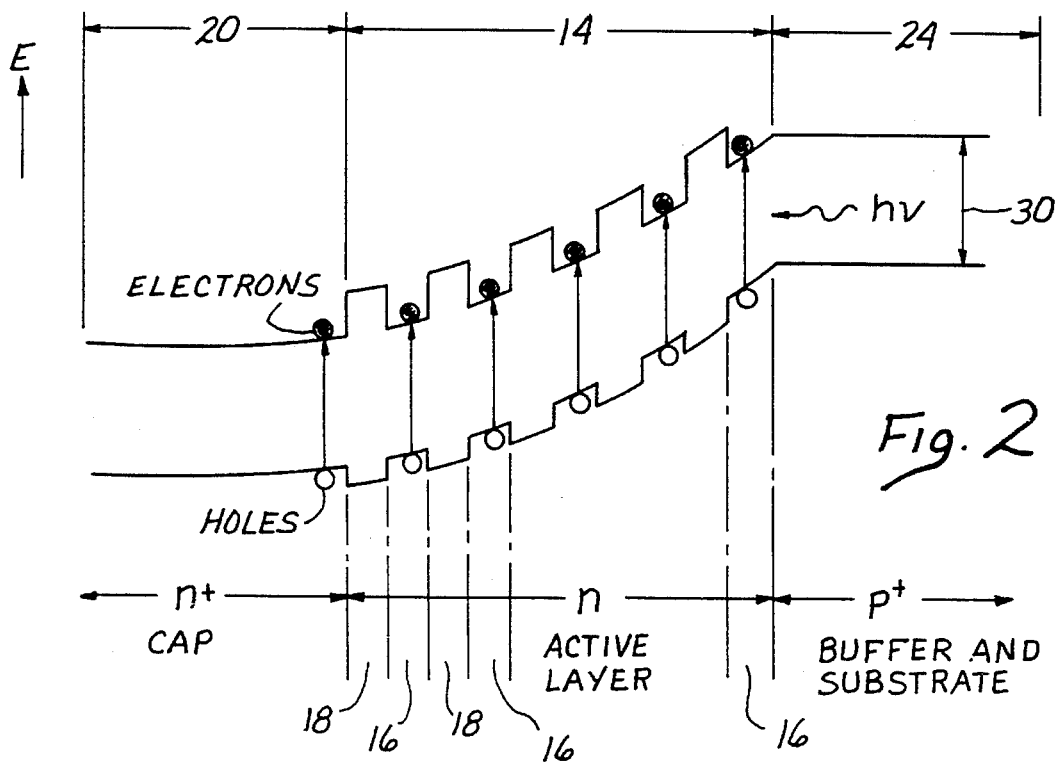
FIG. 2 is an energy band diagram of the device of FIG. 1.

The operation of the IMPATT device of FIG. 1 can be better understood by viewing the band diagram of FIG. 2. N cap 22 and drift region 20 is shown in the left of FIG. 2, region 14 comprises the mid-portion of the band diagram, and the right hand portion of the Figure corresponds to P+ buffer 24 and substrate 26. The vertical axis represents the energy of the electrons. Each quantum well is defined by aluminum gallium arsenide layer 18 which is disposed between two adjacent gallium arsenide layers 16. The aluminum gallium arsenide layer 18 is considered a barrier layer and is provided with sufficient width so that the carriers therein can be accelerated by the electric fields to gain additional energy. However, the width of the barrier is not so great that impact ionization can occur to any substantial extent within barrier region 18. When an electron (hole) enters the wide bandgap material, layer 18, it gives up some energy to the band discontinuity and encounters a higher ionization threshold energy. Therefore, it can accelerate to a higher energy without impact ionization and energy relaxation in barrier region 18, as long as the barrier thickness or width is less than the energy relaxation length. In other words, an electron (hole) starts from a nonzero energy for impact ionization when the electron (hole) exits the barrier and enters the well. The nonzero starting energy for impact ionization increases as the electric field is higher. Furthermore, the periodic property of a multiquantum well structure serves as a constant supply for the energy.

In the illustrated embodiment the optimal length for both barrier and well length is approximately between 75 to 200 angstroms. Therefore, thicknesses for both regions 16 and 18 are shown as 100 angstroms though other numbers could have been chosen, such as 90 angstroms for gallium arsenide layer 16 and 150 angstroms for aluminum gallium arsenide layer 18 or other combinations within the spirit of the present teaching. For quantum wells 16 in the avalanche region shown FIG. 2, an electron (hole) gains energy from the electric field while traveling through the ionization-free potential barrier 18. Thus, when the high energy electron (whole) exits the barrier 18, it enters well 16 and sees a less effective ionization threshold energy. Because the high electric field leads to a stronger reduction in the effective ionization threshold energy of well 16, the quantum well structure in active region 14 enhances the nonlinearity of the avalanche process and reduces the ionization rates saturation limitations for active region 14. Therefore, the device of the invention out performs both gallium arsenide and silicon IMPATT devices known in the prior art, particularly at frequencies above 70 GHz.

The illustrated embodiment has been successfully operated with both pulsed and continuous wave operations in the W band frequencies, namely 75 to 110 GHz. The efficiency of the device depends in part upon the resonant circuit to which it is connected, but an actual demonstrated output of 127 milliwatts (2.2 percent efficiency) pulsed operation at 94 GHz and 6.4 milliwatts continuous wave power at 100 GHz has been realized with nonoptimized resonant circuits. Eventually it is expected that 14 percent efficiency at 94 GHz and 10 percent efficiency at 140 GHz will be realized for single drift, flat profile devices. Much higher efficiencies and powers are anticipated using double drift or Read type devices.

The avalanche process in IMPATT devices is intrinsically noisy. Therefore, IMPATT oscillators are usually injection locked to achieve low noise in practical systems. In the illustrated embodiment, the number of carriers within the structure can be selectively increased in the quantum well region 16 in active layer 14 by illuminating layer 14 with a wavelength of light 36 from laser 34 having a quantum energy equal to the band gap energy 30. Carriers generated within well region 16 by light will obtain enough energy when traveling through potential barrier 18 and will significantly reduce ionization rate saturation limitations. The production of carriers will enhance the current through the device and will be modulated by any optical modulation of the locking optical beam 36. Therefore, using conventional optical injection locking, high frequency oscillation at very low noise levels can be realized within the IMPATT device of the invention. The device of the invention is ideal for injection locking and optically tuning by beating two laser beams close in wavelength to form an optical mixed mode, or by using a mode lock semiconductor laser as the injection source.

Figure 3:
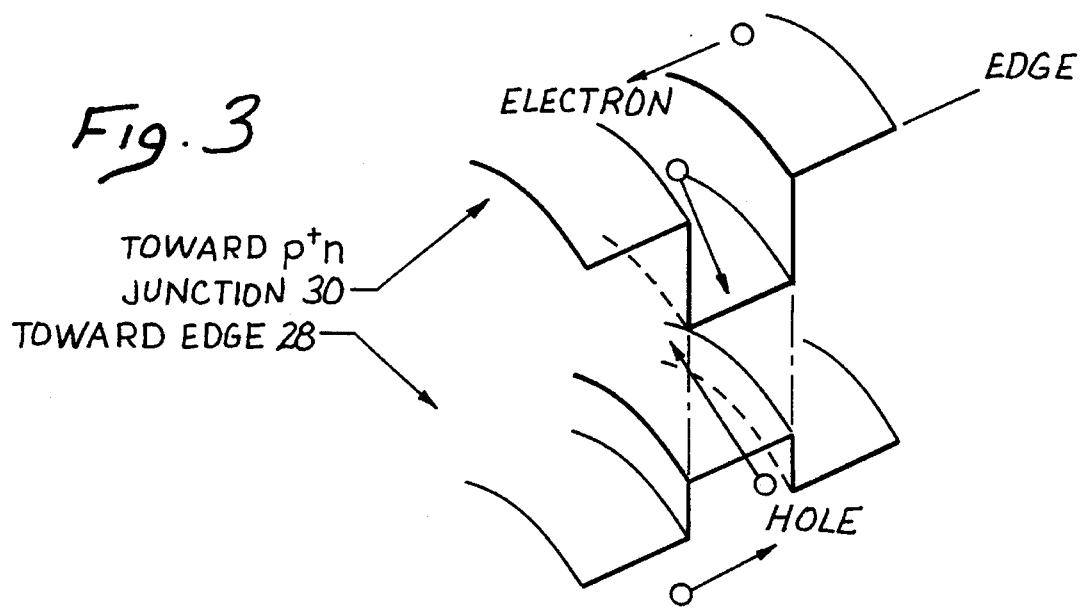
FIG. 3 is an energy band diagram for the edge of the device shown in FIG. 1.

The structure of FIG. 1 is shown as grown in a P+ gallium arsenide substrate 26. P+ substrate 26 plays an important role in device stability. Because IMPATT devices are normally flip-chip mounted to dissipate heat efficiently, the edge slope 28 of the diode mesa shown in FIG. 1 result in equal potential lines bending toward the P+ end junction 32 between layers 24 and 14. An energy band diagram for the device in portion 35 shown in FIG. 1 is depicted in FIG. 3. Because quantum well 16 has a probability of trapping carriers, the band bending near edge 28 will keep trapped holes away from edge 28 and push trapped electrons toward edge 28. Thus, the lower effective doping produced by this carrier bias causes the edge breakdown voltage along edge 28 to be higher and prevents early edge breakdown. If on the other hand, an N+ substrate instead of the P+ substrate 26 were grown on the IMPATT device, a lower edge breakdown voltage would occur and cause device failure. In the case of device failure, typically edge breakdown causes a conduction path to be burned along edge 28 with the result that the current no longer flows through IMPATT diode 10 but is shorted around it.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptionally equivalent, and also what essentially incorporates the germ of the invention.

We claim:

1. An improvement in a multiple quantum well impact ionization avalanche transit time device (IMPATT) having a P+ substrate, a P+ buffer disposed adjacent to said P+ substrate, at least one N type heterojunction disposed adjacent to said P+ buffer, an N type drift region disposed adjacent to said at least one N type heterojunction, and an N+ type cap layer disposed adjacent to said N type drift layer, wherein said at least one heterojunction further comprises the improvement of a plurality of N type heterojunctions having an energy bandgap greater than the energy bandgap of said P+ buffer to form a corresponding plurality of quantum wells disposed adjacent to said P+ buffer, said plurality of quantum wells comprising a plurality of pairs of layers forming each junction, one layer of said pair being a barrier layer and the other layer of said pair being a quantum well layer, the thickness of said layers having a length of approximately comparable to the energy relaxation length of electrons and holes, whereby a high power high efficiency multiple quantum well IMPATT device is provided.

2. The device of claim 1 wherein said barrier layer is comprised of aluminum gallium arsenide and wherein said quantum well layer is comprised of gallium arsenide and wherein each have a thickness in the range of approximately 75 to 200 angstroms which layer thickness is approximately comparable to the energy relaxation length of electrons and holes in said layers.

3. The device of claim 2 wherein said barrier layer and quantum well layer each have a thickness of approximately 100 angstroms.

4. A multiple quantum well impact ionization avalanche transit time device (IMPATT) comprising:

a P+ substrate;

a P+ buffer disposed adjacent to said P+ substrate;

a plurality of N type heterojunctions having an energy bandgap greater than the energy bandgap of said P+ buffer to form a corresponding plurality of quantum wells disposed adjacent to said P+ buffer;

an N type drift region disposed adjacent to said plurality of N type heterojunctions; and an N+ type cap layer disposed adjacent to said N type drift layer, wherein said plurality of N type heterojunctions comprise a plurality of pairs of thin films, each pair of said thin films comprising a barrier layer and a quantum well layer;

wherein said barrier layer has a greater energy gap than said quantum well layer; and wherein said quantum well layer has a higher doping concentration than said barrier layer for a simple growth condition of a constant Si flux, whereby a high power high efficiency multiple quantum well IMPATT device is provided.

5. A multiple quantum well impact ionization avalanche transit time device (IMPATT) comprising:

a P+ substrate;

a P+ buffer disposed adjacent to said P+ substrate;

a plurality of N type heterojunctions having an energy bandgap greater than the energy bandgap of said P+ buffer to form a corresponding plurality of quantum wells disposed adjacent to said P+ buffer;

an N type drift region disposed adjacent to said plurality of N type heterojunctions; and an N+ type cap layer disposed adjacent to said N type drift layer, wherein said plurality of N type heterojunctions is comprised of a plurality of pairs of layers forming each junction, one layer of said pair being a barrier layer and the other layer of said pair being a quantum well layer, the thickness of said layers having a length of approximately comparable to the energy relaxation length of electrons and holes, and further comprising means for irradiating at least said plurality of N type heterojunctions with light having a predetermined frequency with an energy at least as great as the energy gap of carriers in said quantum well layers, whereby a high power high efficiency IMPATT device is provided.

6. The device of claim 5 wherein said plurality of N type heterojunctions comprise at least enough pairs of barrier and quantum well layers to equal the avalanche region of said device.

7. The device of claim 1 wherein said substrate, buffer, drift and cap layers are comprised of gallium arsenide and wherein said plurality of N type heterojunctions are comprised of pairs of gallium arsenide layers with corresponding aluminum gallium arsenide layers to form said heterojunction.

8. A multiple quantum well impact ionization avalanche transit time device (IMPATT) comprising:

a P+ substrate;

a P+ buffer disposed adjacent to said P+ substrate;

a plurality of N type heterojunctions having an energy bandgap greater than the energy bandgap of said P+ buffer to form a corresponding plurality of quantum wells disposed adjacent to said P+ buffer;

an N type drift region disposed adjacent to said plurality of N type heterojunctions; and an N+ type cap layer disposed adjacent to said N type drift layer, wherein said substrate, buffer, drift and cap layers are comprised of gallium arsenide and wherein said plurality of N type heterojunctions are comprised of pairs of gallium arsenide layers with corresponding aluminum gallium arsenide layers to form said heterojunction; and wherein said plurality of N type heterojunctions is comprised of a plurality of pairs of layers forming each junction, one layer of said pair being a barrier layer and the other layer of said pair being a quantum well layer, the thickness of said layers having a length of approximately equal to the energy relaxation length of electrons and holes, and further comprising means for irradiating at least said plurality of N type heterojunctions with light having said predetermined frequency, said plurality of N type heterojunctions comprising at least enough pairs of barrier and quantum well layers to equal the avalanche region of said device, whereby a high power high efficiency multiple quantum well IMPATT device is provided.

9. The device of claim 1 wherein said layers collectively form a mesa structure having an apex and a base with said P+ substrate being at said apex of said mesa structure and said N+ cap layer being at said base of said mesa structure, said mesa structure being characterized by having a curved edge surface from said P+ substrate flaring out to a larger base of said N+ cap layer to increase edge breakdown voltage along said curved edge of said mesa structure.

10. A method of generating a narrow avalanche injection current through a IMPATT diode having an electric field impress thereacross comprising the steps of:

accelerating carriers through a thin film barrier layer to a higher energy state without creating substantial impact ionization;

optically and voltaicly injecting said accelerated carriers through said thin film barrier layer into a thin film quantum well layer having an energy bandgap smaller than the energy bandgap of said thin film barrier to generate substantial avalanche impact ionization, the thickness of said quantum well layer being limited by both the energy relaxation length and ionization mean free path;

optically and voltaicly injecting said carriers generated by said impact ionization into a subsequent thin film barrier layer; and repeating said steps of accelerating said carriers within successive thin film barrier layers and optically and voltaicly injecting said accelerated carriers into an adjacent thin film quantum well layer to generate impact ionization of carriers at an enhanced rate, so that high efficiency high frequency operation of said device is provided.

11. The method of claim 10 where said step of repeating is repeated at least five times.

12. The method of claim 10 wherein said barrier layer is comprised of aluminum gallium arsenide and wherein said quantum well layer is comprised of gallium arsenide and where said step of accelerating said carriers across said thin film barrier layer is performed across a thin film barrier layer having a thickness of approximately 75 to 200 angstroms, which layer thickness is approximately comparable to the energy relaxation length of electrons and holes in said layers.

13. The method of claim 10 wherein said barrier layer is comprised of aluminum gallium arsenide and wherein said quantum well layer is comprised of gallium arsenide and where said step of accelerating said carriers across said thin quantum well layer is performed across a thin quantum well layer having a thickness of approximately 75 to 200 angstroms, which layer thickness is approximately comparable to the energy relaxation length of electrons and holes in said layers.

14. A method of generating a narrow avalanche injection current through a IMPATT diode having an electric field impress thereacross comprising the steps of:

accelerating carriers through a thin film barrier layer to a higher energy state without creating substantial impact ionization;

injecting said accelerated carriers from said thin film barrier layer into a thin film quantum well layer having an energy bandgap smaller than the energy bandgap of said thin film barrier to generate substantial avalanche impact ionization, the thickness of said quantum well layer being limited by both the energy relaxation length and ionization mean free path;

injecting said carriers generated by said impact ionization into a subsequent thin film barrier layer;

repeating said steps of accelerating said carriers within successive thin film barrier layers and injecting said accelerated carriers into an adjacent thin film quantum well layer to generate impact ionization of carriers at an enhanced rate, so that high efficiency high frequency operation of said device is provided; and irradiating said thin film barrier layers and thin film quantum well layers with light at a predetermined frequency having an energy at least as great as the energy gap of carriers in said thin film quantum well layers.

15. The method claim 14 where said steps of accelerating said carriers across said thin film barriers and generating impact ionization within said thin film quantum well are performed across a thickness of said thin film barrier layer and thin film quantum well layer cumulatively equal to approximately the energy relaxation length of electrons and holes.

16. The method of claim 14 wherein said step of irradiating with light comprises the step of irradiating said thin film barrier layer and thin quantum well layer with modulated light to modulate current within said device.

* * * * *